United States Patent [19]

Quayle

[11] 4,243,985

[45] Jan. 6, 1981

[54] ANALOGUE VOLTAGE INDICATOR WITH SEQUENCE OF LIGHT EMITTING DIODES

[75] Inventor: Ian H. Quayle, Needingworth, England

[73] Assignee: Chronolog Systems Limited, London, England

[21] Appl. No.: 902,663

[22] Filed: May 4, 1978

[51] Int. Cl.[2] .................................... G06F 3/14
[52] U.S. Cl. ............................ 340/753; 324/96; 324/122; 340/782; 340/811
[58] Field of Search ............... 324/96, 122; 340/753, 340/754, 782, 811, 813

[56] References Cited

U.S. PATENT DOCUMENTS

| | | | |
|---|---|---|---|
| 3,796,951 | 3/1974 | Joseph | 340/753 |
| 3,969,672 | 7/1976 | Wallander et al. | 340/753 |
| 3,987,392 | 10/1976 | Kugelmann et al. | 340/753 |
| 4,039,956 | 8/1977 | Shimanek et al. | 340/753 |
| 4,050,308 | 9/1977 | Lee | 340/753 |

*Primary Examiner*—Marshall M. Curtis
*Attorney, Agent, or Firm*—Quarles & Brady

[57] ABSTRACT

A circuit serves to illuminate appropriate light emitting diodes of a sequence to provide a bar graph type display of an analogue input voltage. The light emitting diodes are divided into sets with each set being associated with a respective signal processing element which may be a differential amplifier supplied with the analogue input voltage at one input terminal and a unique off-set voltage at the other. The signal processing elements handle respective contiguous ranges of the analogue voltage and the required supply voltage is reduced.

8 Claims, 1 Drawing Figure

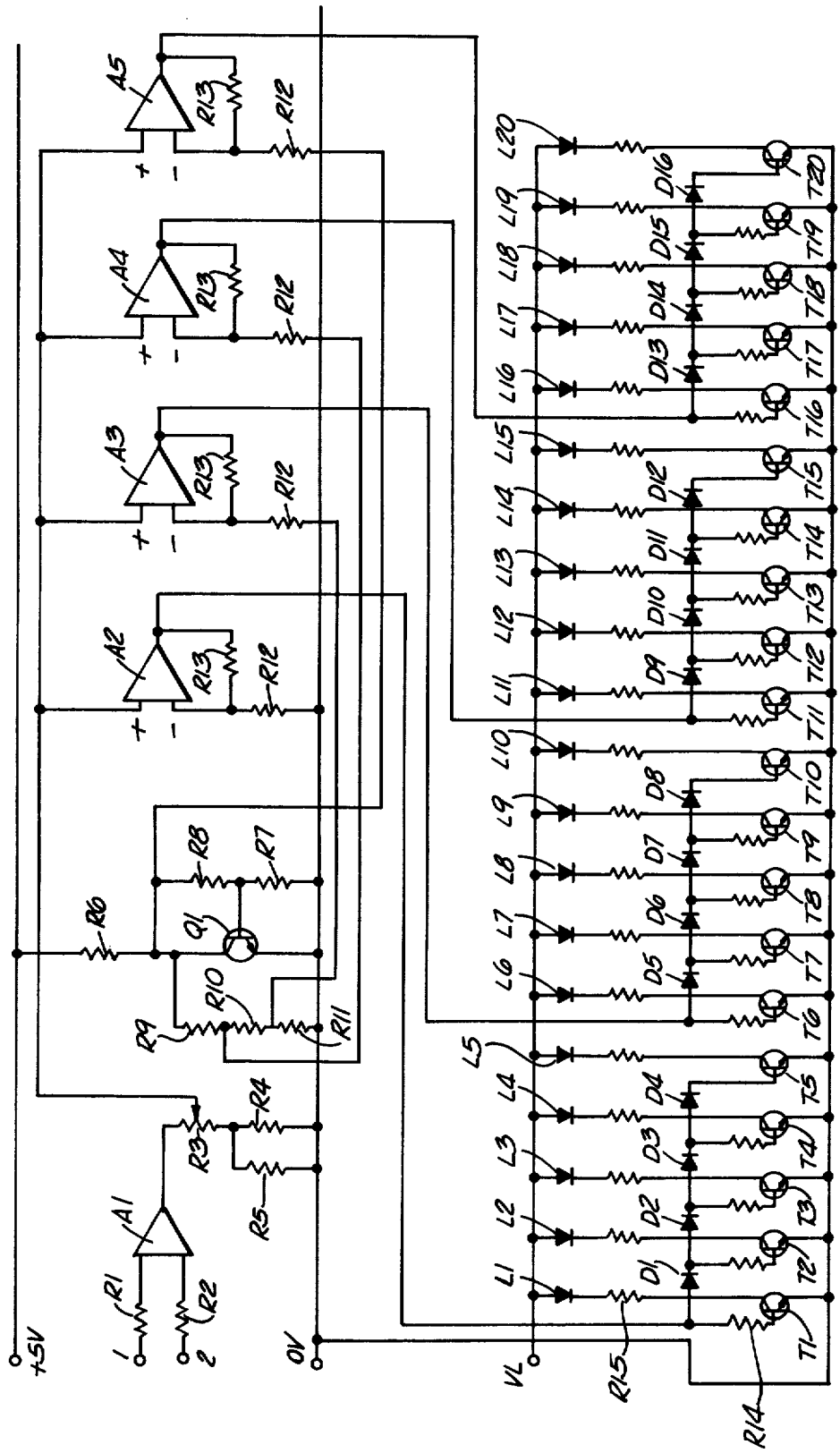

ANALOGUE VOLTAGE INDICATOR WITH SEQUENCE OF LIGHT EMITTING DIODES

This invention relates to electrical circuit means comprising a sequence of light emitting diodes which are illuminated at unique levels of an analogue input voltage to provide a display of the magnitude of that voltage.

It is a disadvantage of previous circuits of this type that the required supply voltage increases as the number of light emitting diodes increases. If for example, the levels of the analogue input voltage, which correspond with illumination of the respective light emitting diodes, are defined by means of semiconductor elements, the voltage difference between adjacent levels may be of the order of 0.6 volts. Even if only a modest number such as twenty light emitting diodes are required, the total voltage swing to pass through the twenty levels will be 12 volts and the supply voltage must exceed this.

One object of the present invention is to provide electrical circuit means whereby sufficient light emitting diodes can be employed to give the required accuracy in the display without the necessity for an inconveniently high supply voltage.

Accordingly, the present invention consists in analogue voltage display means comprising: an analogue voltage input for receipt of an analogue voltage signal to be displayed; a plurality of sets of light emitting diodes, said sets being together arranged to provide a display of a single sequence of light emitting diodes; a plurality of signal offsetting elements, there being one such element for each set of light emitting diodes, each signal offsetting element being connected with said input to receive the analogue voltage signal; offset voltage means supplying a different offset voltage to each signal offsetting element whereby the elements provide, over respective contiguous ranges of the analogue voltage signal, respective offset analogue voltage signals which are indicative of the analogue voltage signal to be displayed and which vary within voltage ranges which are similar as between the signal offsetting elements; and a plurality of control means, there being one such control means for each set of light emitting diodes, each control means being connected to receive the offset voltage signal from the corresponding signal offsetting element and comprising reference means which defines levels of the said offset voltage signal corresponding respectively with the light emitting diodes of the associated set and a semiconductor switch for each light emitting diode of the associated set, each semiconductor switch being actuable selectively to enable or inhibit current flow through the light emitting diode, the semiconductor switches for each set being respectively actuated as the corresponding offset analogue voltage signal reaches the levels defined for the respective light emitting diodes of the set, so that the light emitting diodes of the sequence are illuminated at unique levels of the analogue voltage signal to provide a visual indication thereof.

Preferably, the signal offsetting elements comprise respective differential amplifiers having first input terminals connected to said input and second input terminals connected for receipt of the associated off-set voltage.

Suitably, said first input terminals are connected to the input by means of a voltage divider incorporating a thermistor to compensate for the temperature coefficient of the off-set voltage means and reference means.

In one form of the invention, the semiconductor switches comprise junction transistors having collector and emitter connected in series with the corresponding light emitting diode between voltage rails, and the reference means for each control means comprises a chain of diodes connected at one end to the output of the associated differential amplifier, the transistor bases being connected with respective points in the diode chain.

Suitably, the off-set voltage means comprises an off-set voltage divider and a junction transistor so connected as in use to provide to the offset voltage divider an off-set voltage corresponding to the amplified base-emitter voltage of the transistor, said second input terminals of the differential amplifiers being connected to respective points of the off-set voltage divider so as to receive multiples of said off-set voltage.

The invention will now be described by way of example with reference to the accompanying drawing which is a circuit diagram of an electrical circuit according to the invention.

The analogue voltage signal which is to be displayed is applied to terminals 1 and 2 of the circuit, these terminals being connected by respective resistors R1 and R2 to the operational amplifier A1. The operational amplifier is connected with the +5V and 0V rails in conventional manner and has a gain which is chosen to give the sensitivity required of the circuit. Preferably, this amplifier incorporates an off-set control potentiometer in order to permit accurate setting of the zero-point of the circuit. A potentiometer R3 and a thermistor R4 are connected in series between the output of A1 and the ground rail. A resistor R5 is connected in parallel with the thermistor R4. The wiper of potentiometer R3 is connected to the positive input of four differential amplifiers A2 to A5. It will be appreciated that each of the four amplifiers A2 and A5 receives the same positive input voltage which is dependent upon the analogue input voltage on pins 1 and 2 but which can be varied through potentiometer R3 for calibration purposes.

A transistor Q1 has its emitter connected with the ground rail and its collector connected by means of resistor R6 with the +5V rail. The base of Q1 is connected by biasing resistors R7 and R8 respectively with the ground rail and with the collector. As a result transistor Q1 provides a fixed voltage across its collector and emitter which voltage is applied to a voltage divider comprising the series connection of three equal resistors R9, R10 and R11. From corresponding points of this divider, the four amplifiers A2 to A5 receive respective multiples of an off-set voltage, equivalent to the amplified base-emitter voltage of transistor Q1. Thus the negative input of A2 is connected via resistor R12 to the ground rail; the negative input of A3 is similarly connected to the junction of resistors R10 and R11; the negative input of A4 is connected to the junction of resistors R10 and R9 and the negative input of A5 is connected to the junction of resistor R9 and the collector of Q1. Each of the amplifiers A2 to A5 is further provided with a negative feed-back resistor R13.

The outputs of amplifiers A2 to A5 are taken to one end of a corresponding chain of diodes, D1 to D4, D5 to D8, D9 to D12 and D13 to D16 respectively. Corresponding points in these diode chains are connected through respective resistors R14 to the bases of transistors T1 to T20, with the exception that the end of each diode chain remote from the associated differential amplifier is connected directly to the base of the associated transistor rather than via a resistor. Each of the transistors T1 to T20 has its collector and emitter connected in series with a corresponding light emitting diode L1 to L20 and a current limiting resistor R15 between the ground rail and voltage rail $V_L$. A voltage is provided on rail $V_L$ appropriate to the light emitting diodes.

The operation of this circuit can now be understood. Each differential amplifier A2 to A5 receives an amplified version of the analogue input voltage at its positive input terminal and a particular off-set voltage at the negative input terminal. In the described arrangement, A2 receives zero off-set voltage, A3 unity off-set, A4 twice the off-set of A3 and A5 three times the off-set of A3. As the signal taken from potentiometer R3 rises from zero, the output of A2 begins to rise positively in proportion to the analogue input voltage. As the signal from potentiometer R3 reaches the off-set of A3, say 3 volts, the output of A3 next begins to rise. It will be seen that in this way the four differential amplifiers process the input signal to provide processed signals over respective contiguous ranges of the input signal, the processed signals being indicative of the analogue voltage that is to be displayed and being in fact a multiple of that voltage less a constant which differs from one differential amplifier to the next according to the off-set.

The behaviour of each set of light emitting diodes, for example L1 to L5, with the associated transistors T1 to T5, diode chain D1 to D4 and resistors R15 and R14, is the same and only the first such set will be discussed in detail. Initially, each of the transistors T1 to T5 will be switched off and no current will flow through any of the corresponding light emitting diodes. As the associated processed signal from differential amplifier A2 rises, transistor T1 will first be switched on, thus illuminating L1. As the signal further increases D1 will conduct to enable transistor Q3 to be switched on illuminating L2, and the process will repeat itself as the input voltage continues to rise. At the level of the analogue voltage at which transistor T5 is switched on, amplifier A3 is beginning to provide a positive output and the second set of light emitting diodes L6 to L10 will be sequentially illuminated as the analogue voltage increases through the next range of values. The whole sequence of light emitting diodes accordingly provides in bar-graph form a visual indication of the analogue voltage signal.

To ensure that the input voltage interval between illumination of the last of one set of light emitting diodes and illumination of the first light emitting diode of the adjacent set is equal to the interval between illumination of adjacent light emitting diodes of one set, it is necessary to arrange for the off-set voltages to be related to the levels defined by the diode chains. Since the voltage drop across a single diode in the chain is approximately 0.6 volts, the off-set voltages supplied to the differential amplifiers A2 to A5 are arranged to differ by 3 volts, that is to say the drop across five diodes. The characteristics of a diode are strongly temperature dependent, however, and if steps were not taken, this relationship would break down if the ambient temperature varied significantly. To combat this, the off-set voltages for the differential amplifiers are derived from the base-emitter voltage of transistor Q1, since the characteristics of the base-emitter junction are substantially those of a diode. In this way, linearity of the display is achieved over a reasonable range of temperature, but to reduce the overall temperature coefficient of the circuit the thermistor R4 is employed. The resistance of thermistor R4 has a logarithmic dependence on temperature, but if the thermistor is correctly chosen its temperature coefficient will exactly compensate for that of the diodes and off-set voltages at the working ambient temperature. Above and below that temperature the compensation will of course not be exact, but the overall temperature coefficient of the device will be reduced to a satisfactory level over a reasonable temperature range. The effect of resistor R5 is to extend the temperature range over which the compensation is effective.

An important advantage of the described circuit is that twenty light emitting diodes may be controlled with a supply voltage of as low as 5 volts. Without the four differential amplifiers which divide up the analogue input into contiguous ranges, a voltage swing of at least 12 volts would be required to pass through the twenty levels defined by the diodes and the supply to amplifier A1 would clearly have to exceed that amount.

It should be understood that this invention has been described by way of example only and that significant modifications are possible without departing from the scope of the invention. Thus the number of light emitting diodes in each set, or the number of signal offsetting elements in the form of amplifiers A2 to A5, can be varied to suit the requirements of the display. The light emitting diodes of each set may be connected in series with a current source rather than in parallel as described, with the associated semiconductor switch, such as the transistors T1 to T20, then being connected in parallel with its light emitting diode. The diodes D1 to D16 may be connected in the emitter circuits of the respective transistors so as to define the levels at which the transistors are switched on, or still other forms of reference means could be used. The thermistor could be replaced by other temperature sensitive means which, preferably, have a temperature response similar to that of the off-set and reference means so that good temperature compensation is achieved over a wide temperature range.

If analogue parameters other than voltage are required to be displayed, the appropriate circuitry can be added before the input of the circuit that has been described in order first to produce an analogue voltage representative of that parameter.

I claim:

1. Analogue voltage display means comprising:
   an analogue voltage input for receipt of an analogue voltage signal to be displayed;
   a plurality of sets of light emitting diodes, said sets being together arranged to provide a display of a single sequence of light emitting diodes;
   a plurality of signal offsetting elements, there being one such element for each set of light emitting diodes, each signal offsetting element being connected with said input to receive the analogue voltage signal;
   offset voltage means supplying a different offset voltage to each signal offsetting element whereby the elements provide, over respective contiguous ranges of the analogue voltage signal, respective offset analogue voltage signals which are indicative of the analogue voltage signal to be displayed and which vary within voltage ranges which are similar as between the signal offsetting elements; and
   a plurality of control means, there being one such control means for each set of light emitting diodes, each control means being connected to receive the offset voltage signal from the corresponding signal offsetting element and comprising reference means which defines levels of the said offset voltage signal corresponding respectively with the light emitting diodes of the associated set and a semiconductor switch for each light emitting diode of the associated set, each semiconductor switch being actuable selectively to enable or inhibit current flow through the light emitting diode, the semiconductor switches for each set being respectively actuated as the corresponding offset analogue voltage signal reaches the levels defined for the respective light emitting diodes of the set, so that the light emitting diodes of the sequence are illuminated at unique levels of the analogue voltage signal to provide a visual indication thereof.

2. Electrical circuit means according to claim 1, wherein the signal offsetting elements comprise respective differential amplifiers having first input terminals connected to said input and second input terminals connected for receipt of the associated off-set voltage.

3. Electrical circuit means according to claim 2, wherein said first input terminals are connected to the input by means of a voltage divider incorporating a thermister to compensate for the temperature coefficient of the off-set voltage means and reference means.

4. Electrical circuit means according to claim 3, wherein said voltage divider further incorporates a potentiometer for calibration.

5. Electrical circuit means according to any one of claims 2, 3 and 4, wherein the off-set voltage means comprises an off-set voltage divider and means for applying in use a fixed off-set voltage to said divider, the second input terminals of the differential amplifiers being connected to respective points of the off-set voltage divider so as to receive multiples of said off-set voltage.

6. Electrical circuit means according to claim 5, wherein the means for applying the off-set voltage comprise a junction transistor so connected as in use to provide to the off-set voltage divider an off-set voltage corresponding to the amplified base-emitter voltage of the transistor.

7. Electrical circuit means according to claim 1, wherein the semiconductor switches comprise respective junction transistors having collector and emitter connected in series with the corresponding light emitting diode between voltage rails.

8. Electrical circuit means according to claim 7 wherein the reference means for each control means comprises a chain of diodes connected at one end to the output of the associated signal processing element, the transistor bases being connected with respective points in the diode chain.

* * * * *